(12) United States Patent
Andrews et al.

(10) Patent No.: US 7,279,346 B2
(45) Date of Patent: Oct. 9, 2007

(54) METHOD FOR PACKAGING A LIGHT EMITTING DEVICE BY ONE DISPENSE THEN CURE STEP FOLLOWED BY ANOTHER

(75) Inventors: Peter Andrews, Durham, NC (US); Thomas G. Coleman, Pittsboro, NC (US); James Ibbetson, Goleta, CA (US); Michael Leung, Port Hueneme, CA (US); Gerald H. Negley, Carrboro, NC (US); Eric Tarsa, Goleta, CA (US)

(73) Assignee: Cree, Inc., Durham, NC (US)

( * ) Notice: Subject to any disclaimer, the term of this patent is extended or adjusted under 35 U.S.C. 154(b) by 42 days.

(21) Appl. No.: 11/044,126

(22) Filed: Jan. 27, 2005

(65) Prior Publication Data

US 2005/0218421 A1    Oct. 6, 2005

Related U.S. Application Data

(60) Provisional application No. 60/557,924, filed on Mar. 31, 2004.

(51) Int. Cl.
*H01L 33/00* (2006.01)
(52) U.S. Cl. ............................... 438/27; 257/E33.059
(58) Field of Classification Search ............... 438/26, 438/27, 29; 257/98, 100, E33.059
See application file for complete search history.

(56) References Cited

U.S. PATENT DOCUMENTS

| | | | | |
|---|---|---|---|---|
| 3,805,347 | A | * 4/1974 | Collins et al. | 445/24 |
| 3,875,456 | A | 4/1975 | Kano et al. | 313/501 |
| 4,822,536 | A | * 4/1989 | Voinis et al. | 264/446 |
| 4,918,497 | A | 4/1990 | Edmond | 357/17 |
| 4,966,862 | A | 10/1990 | Edmond | 437/100 |
| 5,027,168 | A | 6/1991 | Edmond | 357/17 |
| 5,043,716 | A | 8/1991 | Latz et al. | 340/782 |
| 5,210,051 | A | 5/1993 | Carter, Jr. | 437/107 |
| 5,338,944 | A | 8/1994 | Edmond et al. | 257/76 |

(Continued)

FOREIGN PATENT DOCUMENTS

DE    101 09 349    9/2002

(Continued)

OTHER PUBLICATIONS

International Search Report and Written Opinion of the International Searching Authority for corresponding PCT application No. PCT/US2005/010034, mailed Feb. 22, 2006.

(Continued)

*Primary Examiner*—Sara Crane
*Assistant Examiner*—Andrew O Arena
(74) *Attorney, Agent, or Firm*—Myers Bigel Sibley & Sajovec

(57) ABSTRACT

Methods of packaging a semiconductor light emitting device positioned in a reflective cavity are provided. A first quantity of encapsulant material is dispensed into the reflective cavity including the light emitting device therein and the first quantity of encapsulant in the reflective cavity is cured. A second quantity of encapsulant material is dispensed onto the cured first quantity of encapsulant material. A lens is positioned in the reflective cavity on the dispensed second quantity of encapsulant material. The dispensed second quantity of encapsulant material is cured to attach the lens in the reflective cavity.

18 Claims, 10 Drawing Sheets

U.S. PATENT DOCUMENTS

| | | | |
|---|---|---|---|
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,631,190 A | 5/1997 | Negley | 438/33 |
| 5,739,554 A | 4/1998 | Edmond et al. | 257/103 |
| 5,912,477 A | 6/1999 | Negley | 257/95 |
| 5,959,316 A | 9/1999 | Lowery | 257/98 |
| 6,120,600 A | 9/2000 | Edmond et al. | 117/89 |
| 6,187,606 B1 | 2/2001 | Edmond et al. | 438/46 |
| 6,201,262 B1 | 3/2001 | Edmond et al. | 257/77 |
| 6,604,135 B1 | 8/2003 | Edmond et al. | 437/22 |
| 6,610,563 B1 | 8/2003 | Waitl et al. | |
| 6,635,363 B1 | 10/2003 | Duclos et al. | 428/690 |
| 6,642,652 B2 | 11/2003 | Collins, III et al. | 313/512 |
| 6,744,077 B2 | 6/2004 | Trottier et al. | 257/103 |
| 6,746,295 B2 * | 6/2004 | Sorg | 445/24 |
| 6,747,406 B1 | 6/2004 | Bortscheller et al. | 313/512 |
| 6,917,057 B2 * | 7/2005 | Stokes et al. | 257/98 |
| 2001/0030326 A1 | 10/2001 | Reeh et al. | 257/98 |
| 2002/0057056 A1 | 5/2002 | Okazaki | |
| 2002/0079837 A1 | 6/2002 | Okazaki | |
| 2002/0123164 A1 | 9/2002 | Slater, Jr. et al. | 438/39 |
| 2002/0163001 A1 | 11/2002 | Shaddock | 257/79 |
| 2003/0006418 A1 | 1/2003 | Emerson et al. | 257/79 |
| 2003/0141510 A1 | 7/2003 | Brunner et al. | |
| 2003/0211804 A1 | 11/2003 | Sorg | 445/24 |
| 2004/0041222 A1 | 3/2004 | Loh | 257/433 |
| 2004/0056260 A1 | 3/2004 | Slater, Jr. et al. | 257/79 |

FOREIGN PATENT DOCUMENTS

| | | |
|---|---|---|
| EP | 1 187 226 | 3/2002 |
| JP | 08032120 | 2/1996 |
| JP | 09027643 | 1/1997 |
| JP | 10-65220 | 3/1998 |
| JP | 10-190065 | 7/1998 |
| JP | 3604298 B | 12/2004 |
| JP | 2005-197369 A | 7/2005 |
| WO | WO 01/15242 | 3/2001 |
| WO | WO 2004/068594 | 8/2004 |

OTHER PUBLICATIONS

International Search Report and Written Opinion of the International Searching Authority for International Patent Application No. PCT/US2005/00779 mailed on Feb. 28, 2006.

International Search Report and Written Opinion of the International Searching Authority for International Patent Application No. PCT/US2005/009778 mailed on Mar. 8, 2006.

* cited by examiner

US 7,279,346 B2

METHOD FOR PACKAGING A LIGHT EMITTING DEVICE BY ONE DISPENSE THEN CURE STEP FOLLOWED BY ANOTHER

RELATED APPLICATION

This application claims the benefit of and priority to U.S. Provisional Patent Application No. 60/557,924, entitled "Methods for Packaging a Light Emitting Device," filed Mar. 31, 2004, the disclosure of which is hereby incorporated herein by reference as if set forth in its entirety.

BACKGROUND OF THE INVENTION

This invention relates to semiconductor light emitting devices and fabricating methods therefore, and more particularly to packaging and packaging methods for semiconductor light emitting devices.

It is known to provide semiconductor light emitting device type light sources in packages that may provide protection, color selection, focusing and the like for light emitted by the light emitting device. For example, the light emitting device may be a light emitting diode ("LED"). Various problems may be encountered during packaging of a power LED for use as a light source. Examples of such possible problems will be described with reference to the cross-sectional illustrations of a power LED in FIGS. 1 and 2. As shown in FIGS. 1 and 2, a power LED package 100 generally includes a substrate member 102 on which a light emitting device 103 is mounted. The light emitting device 103 may, for example, include an LED chip/submount assembly 103b mounted to the substrate member 102 and an LED 103a positioned on the LED chip/submount assembly 103b. The substrate member 102 may include traces or metal leads for connecting the package 100 to external circuitry. The substrate 102 may also act as a heatsink to conduct heat away from the LED 103 during operation.

A reflector, such as the reflector cup 104, may be mounted on the substrate 102 and surround the light emitting device 103. The reflector cup 104 illustrated in FIG. 1 includes an angled or sloped lower sidewall 106 for reflecting light generated by the LED 103 upwardly and away from the LED package 100. The illustrated reflector cup 104 also includes upwardly-extending walls 105 that may act as a channel for holding a lens 120 in the LED package 100 and a horizontal shoulder portion 108.

As illustrated in FIG. 1, after the light emitting device 103 is mounted on the substrate 102, an encapsulant material 112, such as liquid silicone gel, is dispensed into an interior reflective cavity 115 of the reflector cup 104. The interior reflective cavity 115 illustrated in FIG. 1 has a bottom surface defined by the substrate 102 to provide a closed cavity capable of retaining a liquid encapsulant material 112 therein. As further shown in FIG. 1, when the encapsulant material 112 is dispensed into the cavity 115, it may wick up the interior side of the sidewall 105 of the reflector cup 104, forming the illustrated concave meniscus.

As shown in FIG. 2, a lens 120 may then be placed into the reflective cavity 115 in contact with the encapsulant material 112. When the lens 120 is placed in the cavity 115, the liquid encapsulant material 112 may be displaced and move through the gap 117 between the lens 120 and the sidewall 105. The encapsulant may, thus, be moved out onto the upper surface of the lens 120 and/or upper surfaces of the sidewall 105 of the reflector cup 104. This movement, which may be referred to as squeeze-out, is generally undesirable for a number of reasons. In the depicted package arrangement, the lens will sit on a lower shelf if the encapsulant is not cured in a domed meniscus shape prior to the lens attach step. This may cause the lens to not float during thermal cycling and fail via delamination of encapsulation to other surfaces or via cohesive failure within the delamination, both of which may affect the light output. The encapsulant material or gel is generally sticky and may interfere with automated processing tools used to manufacture the parts. Moreover, the gel may interfere with light output from the lens 120, for example, by changing the light distribution pattern and/or by blocking portions of the lens 120. The sticky gel may also attract dust, dirt and/or other contaminants that could block or reduce light output from the LED package 100. The gel may also change the shape of the effective lens, which may modify the emitted light pattern/beam shape.

After placement of the lens 120, the package 100 is typically heat-cured, which causes the encapsulant material 112 to solidify and adhere to the lens 120. The lens 120 may, thus, be held in place by the cured encapsulant material 112. However, encapsulant materials having a slight shrinkage factor with curing, such as a silicone gel, generally tend to contract during the heat curing process. In addition, the coefficient of thermal expansion (CTE) effect generally causes higher floating of the lens at elevated temperatures. During cool-down, parts have a tendency to delaminate. As the illustrated volume of encapsulant beneath the lens 120 shown in FIG. 2 is relatively large, this contraction may cause the encapsulant material 112 to delaminate (pull away) from portions of the package 100, including the light emitting device 103, a surface of the substrate 102, the sidewalls 105 of the reflector cup 104 and/or the lens 120 during the curing process. The delamination may significantly affect optical performance, particularly when the delamination is from the die, where it may cause total internal reflection. This contraction may create gaps or voids 113 between the encapsulant material 112 and the light emitting device 103, lens 120, and/or reflector cup 104. Tri-axial stresses in the encapsulant material 112 may also cause cohesive tears 113' in the encapsulant material 112. These gaps 113 and/or tears 113' may substantially reduce the amount of light emitted by the light emitting device package 100. The contraction may also pull out air pockets from crevices (i.e, reflector) or from under devices (i.e., die/submount), which may then interfere with optical cavity performance.

During operation of the lamp, large amounts of heat may be generated by the light emitting device 103. Much of the heat may be dissipated by the substrate 102 and the reflector cup 104, each of which may act as a heatsink for the package 100. However, the temperature of the package 100 may still increase significantly during operation. Encapsulant materials 112, such as silicone gels, typically have high coefficients of thermal expansion. As a result, when the package 100 heats up, the encapsulant material 112 may expand. As the lens 120 is mounted within a channel defined by the sidewalls 105 of the reflector cup 104, the lens 120 may travel up and down within the sidewalls 105 as the encapsulant material 112 expands and contracts. Expansion of the encapsulant material 112 may extrude the encapsulant into spaces or out of the cavity such that, when cooled, it may not move back into the cavity. This could cause delamination, voids, higher triaxial stresses and/or the like, which may result in less robust light emitting devices. Such lens movement is further described, for example, in United States Patent Application Pub. No. 2004/0041222. The sidewalls 105 may also help protect the lens 120 from mechanical shock and stress.

SUMMARY OF THE INVENTION

Embodiments of the present invention provide methods of packaging a semiconductor light emitting device, where the light emitting device may be mounted on a bottom surface of a reflective cavity. A first quantity of encapsulant material is dispensed into the reflective cavity including the light emitting device and the first quantity of encapsulant in the reflective cavity is cured. A second quantity of encapsulant material is dispensed onto the cured first quantity of encapsulant material. A lens is positioned in the reflective cavity on the dispensed second quantity of encapsulant material. The dispensed second quantity of encapsulant material is cured to attach the lens in the reflective cavity.

In other embodiments of the present invention, dispensing a first quantity of encapsulant material into the reflective cavity including the light emitting device includes dispensing a first portion of the first quantity of encapsulant material into the reflective cavity including the light emitting device and a second portion. The first portion is sufficient to wet the light emitting device without filling the reflective cavity to a level exceeding the height of the light emitting device. The second portion of the first quantity of encapsulant material is dispensed onto the first portion of the first quantity of encapsulant material.

In further embodiments of the present invention, dispensing a first quantity of encapsulant material into the reflective cavity including the light emitting device includes dispensing a first portion of the first quantity of encapsulant material into the reflective cavity including the light emitting device and a second portion. The first portion of the first quantity is sufficient to substantially cover the light emitting device without forming any air pockets in the encapsulant material. The second portion of the first quantity of encapsulant material is dispensed onto the first portion of the first quantity of encapsulant material. The second portion may be about twice the first portion. The second quantity may be about equal to the first portion of the first quantity. The first portion may be sufficient to fill the reflective cavity to a height of about 250 microns.

In other embodiments of the present invention, curing the first quantity of encapsulant material includes curing the first portion of the first quantity of encapsulant material before dispensing the second portion of the first quantity of encapsulant material. The first portion of the first quantity of encapsulant material may include a phosphor and the second portion of the first quantity of encapsulant material may be substantially free of phosphor.

In further embodiments of the present invention, the light emitting device is mounted at about a midpoint of the reflective cavity. The encapsulant material may be dispensed at a point displaced from the midpoint towards a sidewall of the cavity so that the encapsulant material is not dispensed directly onto the light emitting device. Alternatively, the encapsulant material may be dispensed directly onto the light emitting device. Dispensing the encapsulant material may include forming a bead of the encapsulant material on an end of a dispenser and contacting the formed bead with the reflective cavity and/or the light emitting device to dispense the bead from the dispenser. The encapsulant material may be a silicone gel. The first quantity of encapsulant material may include a phosphor and the second quantity of encapsulant material may be substantially free of phosphor. In other words, each dispense may be of a material with or without phosphor.

In other embodiments of the present invention, positioning the lens includes advancing the lens into the reflective cavity until it contacts the cured first quantity of encapsulant material. A first quantity of encapsulant material may be dispensed that is sufficient to establish a desired position for the lens in the reflective cavity. The light emitting device may be a light emitting diode (LED).

In further embodiments of the present invention, methods of packaging a semiconductor light emitting device include providing the light emitting device on a bottom surface of a reflective cavity. The light emitting device has a height relative to the bottom surface. A first quantity of encapsulant material is dispensed into the reflective cavity including the light emitting device. The first quantity is sufficient to wet the light emitting device without filling the reflective cavity to a level exceeding the height of the light emitting device. A second quantity of encapsulant material may be dispensed onto the first quantity of encapsulant material. The dispensed encapsulant material is cured.

In other embodiments of the present invention, packaging a semiconductor light emitting device includes providing the light emitting device on a bottom surface of a reflective cavity. A first quantity of encapsulant material is dispensed into the reflective cavity including the light emitting device. The first quantity is sufficient to substantially cover the light emitting device without forming any air pockets in the encapsulant material. A second quantity of encapsulant material may be dispensed onto the first quantity of encapsulant material. The different dispenses may be of different materials having different viscosities or other properties. For example, different viscosities of material may be selected for wetting and/or meniscus formation purposes. The dispensed encapsulant material is cured.

In further embodiments of the present invention, packaging a semiconductor light emitting device includes dispensing a first quantity of encapsulant material having a first index of refraction into a reflective cavity including the light emitting device. The first quantity of encapsulant material is cured. A second quantity of encapsulant material is dispensed onto the cured first quantity of encapsulant material. The second quantity of encapsulant material has a second index of retraction, different from the first index of refraction. The first and second index of refraction are selected to provide a buried lens in the reflective cavity. The second quantity of encapsulant material is cured to form the buried lens.

DETAILED DESCRIPTION

Figure 1:
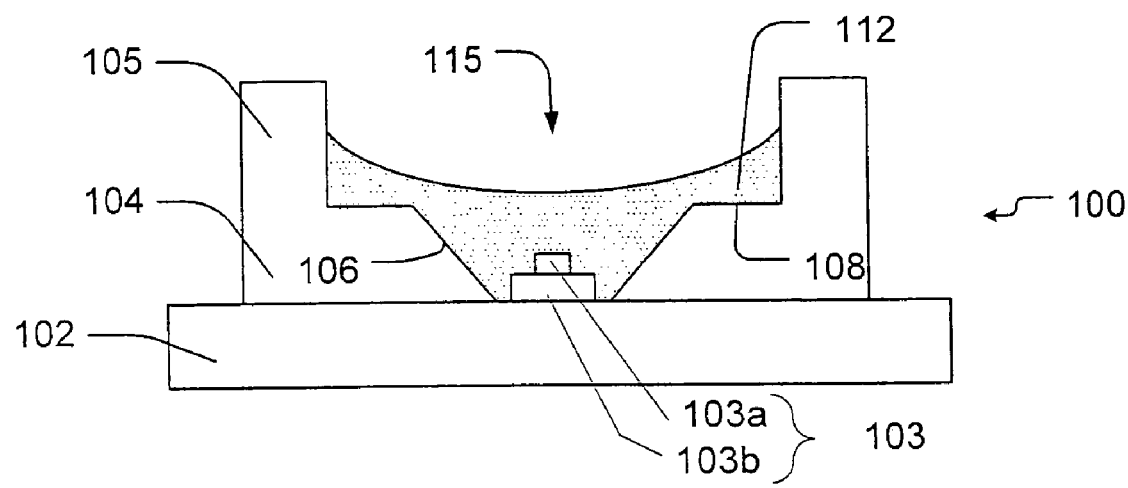
FIGS. 1 and 2 are cross-sectional side views illustrating a conventional light emitting device package.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Various embodiments of the present invention for packaging a semiconductor light emitting device 103 will be described herein. As used herein, the term semiconductor light emitting device 103 may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green light emitting diodes ("LEDs") may be provided. Red and/or amber LEDs may also be provided. The design and fabrication of semiconductor light emitting devices 103 are well known to those having skill in the art and need not be described in detail herein.

For example, the semiconductor light emitting device 103 may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. application Ser. No. 10/659,241, entitled Phosphor-Coated Light Emitting Diodes Including Tapered Sidewalls and Fabrication Methods Therefor, filed Sep. 9, 2003, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1.

Figure 3A:
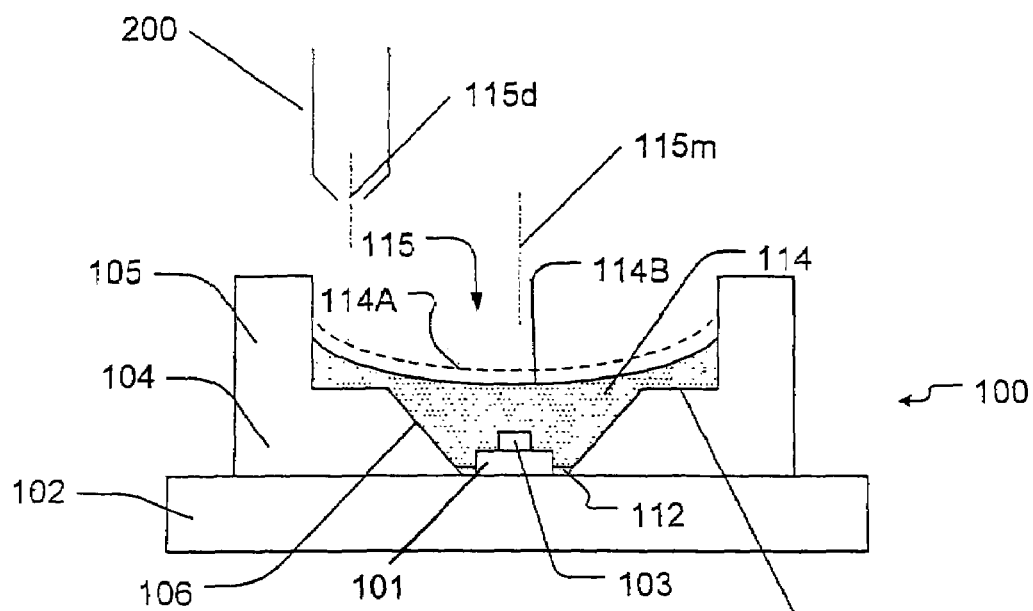
FIGS. 3A to 3C are cross-sectional side views illustrating methods of packaging a light emitting device according to some embodiments of the present invention.
Figure 3B:
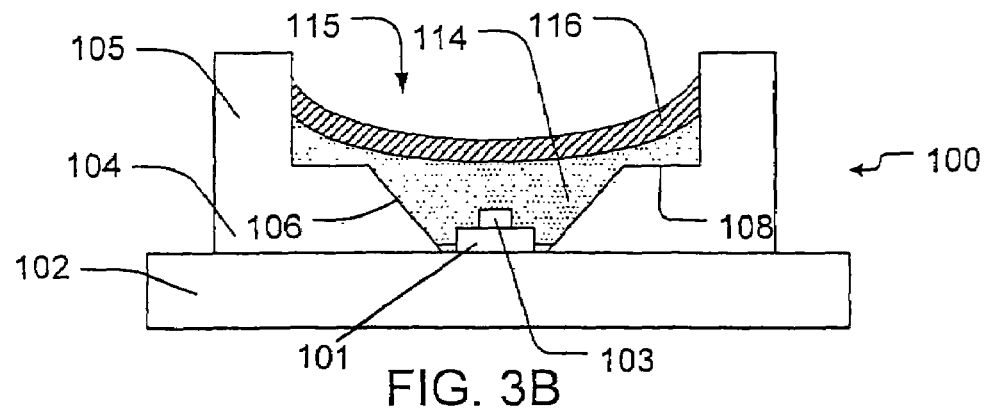
Figure 3C:
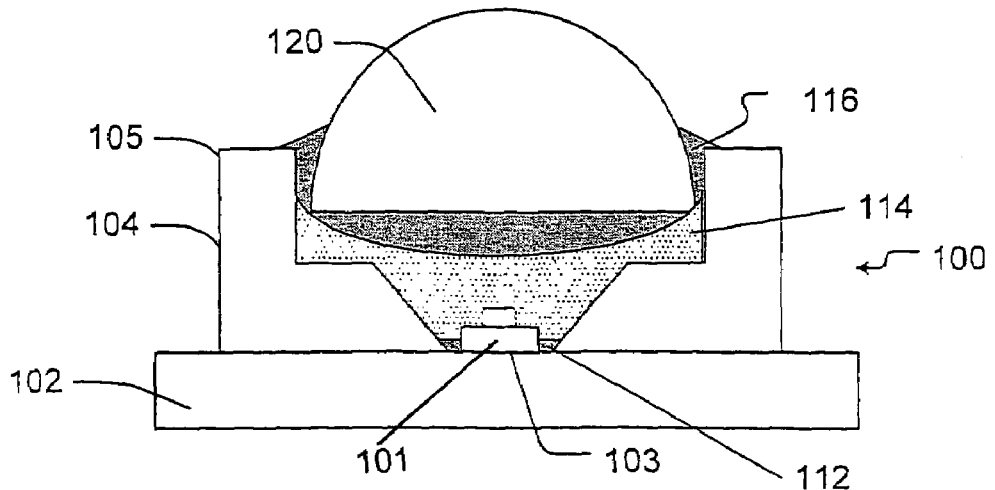

Embodiments of the present invention will now be described with reference to the various embodiments illustrated in FIGS. 3-11. More particularly, some embodiments of a double-cure encapsulation process for use in packaging a light emitting device 103 are illustrated in FIGS. 3A through 3C. Such a double cure encapsulation process may reduce problems associated with shrinkage of encapsulant material during curing. As will be described herein, for some embodiments of the present invention, the double cure process may include three dispense operations and two cure operations. However, it will be understood that more or less dispense operations and cure operations may also be used in packaging the light emitting device in other embodiments of the present invention. As will also be further described herein, embodiments of the present invention also include a multi-dispense operation, leading to a first cure operation followed by another set of dispense and cure operations to attach a lens.

As illustrated in FIG. 3A, a first predetermined amount (quantity) of an encapsulant material, including two encapsulant material portions 112, 114 in the illustrated embodiments, is dispensed within the cavity 115. The encapsulant material 112, 114 may be, for example, a liquid silicon gel, an epoxy or the like. The first portion 112 may be dispensed to wet exposed surface portions of the light emitting device 103, more particularly, the led chip/submount assembly 101 of the light emitting device 103, and the substrate 102. Portions of the reflector cup 104 may also be wet by the initial dispense. In some embodiments of the present invention, the quantity of encapsulant material dispensed as the first portion 112 is sufficient to wet the light emitting device 103 without filling the reflective cavity to a level exceeding the height of the light emitting device 103. In some other embodiments of the present invention, the quantity of encapsulant material dispensed as the first portion 112 is sufficient to substantially cover the light emitting device 103 without forming any air pockets in the encapsulant material 112.

As shown in FIG. 3A, the light emitting device is positioned at about a midpoint 115m of the reflective cavity 115. The encapsulant material may be dispensed from a dispenser 200 at a point 115d displaced from the midpoint 115m towards a sidewall 105 of the reflective cavity 115 so that the encapsulant material 112 is not dispensed directly onto the light emitting device 103. Dispensing encapsulant material 112 directly on the light emitting device 103 may cause trapping of bubbles as the encapsulant material 112 passes over the structure of the light emitting device 103 from above. However, in other embodiments of the present invention, the encapsulant material 112 is dispensed on top of the light emitting device 103 die in addition to or instead of an offset dispense. Dispensing the encapsulant material 112 may include forming a bead of the encapsulant material 112 on an end of a dispenser 200 and contacting the formed bead with the reflective cavity 115 and/or the light emitting device 103 to dispense the bead from the dispenser.

The viscosity and/or other properties of the material used for a dispense may be selected such that, for example, wetting occurs without bubble formation. In further embodiments of the present invention, coatings may be applied to surfaces contacted by the dispensed material to speed/retard the wetting rate. For example, using certain known cleaning procedures that leave microscopic residue, selected surfaces may be treated and, thus, used to engineer the dynamics of the wetting action.

Due to the surface properties of the inner surface of the reflector cup 104 defining the cavity 115, of the light emitting device 103 and of the encapsulant material 112, dispensed encapsulant material 112, even when dispensed from a point 115d displaced from the midpoint 115m of the cavity 115, may flow within the cavity 115 in a manner that could still cause bubbles in the encapsulant material 112. In particular, the encapsulant material 112 is expected to move or "wick" more rapidly around the inner surface of the reflector cup 104 and the sidewalls of the light emitting device 103 faster than over the top of the light emitting device 103. As a result, a bubble could be trapped on a side of the cavity 115 opposite from the side where the encapsulant material is dispensed when the side flowing encapsulant material meets and then encapsulant material flows over the top of the light emitting device 103, thus being locally dispensed from above with no side outlet for air flow. Accordingly, the quantity of the first portion of dispensed encapsulant material 112 may be selected to reduce or prevent the risk of forming such bubbles. As such, as used herein, reference to "substantially" covering the light emitting device 103 refers to covering enough of the structure of the light emitting device 103 so that such a bubble will not result when the remaining portion 114 of the first quantity of encapsulant material 112, 114 is dispensed.

After the initially dispensed encapsulant material 112 is allowed to settle, the second portion 114 of the first predetermined quantity of encapsulant material is dispensed into the reflective cavity 115. The second portion 114 of the encapsulant material, in some particular embodiments of the present invention, is about twice the first portion 112.

After dispensing all the first quantity of encapsulant material 112, 114, the first quantity of the encapsulant material 112, 114 is cured, for example, by a heat treatment, to solidify the encapsulant material 112, 114. After curing, the level of the encapsulant material 112, 114 within the reflective cavity 115 may drop from the level 114A to the level 114B as a result of shrinkage of the encapsulant material 112, 114.

In some embodiments of the present invention, the first portion 112 is cured before the second portion 114 is dispensed into the reflective cavity 115. For example, it is known to add a light converting material, such as a phosphor, nano-crystals, or the like, to the encapsulant material 112, 114 to affect the characteristics of the light emitted from the package 100. For purposes of the description herein, references will be made to a phosphor as a light converting material. However, it will be understood that other light converting materials may be used in place of phosphor. Depending on the desired color spectrum and/or color temperature tuning for the package 100, phosphor may be most beneficially utilized when positioned adjacent the emitter 103b, in other words, directly on top of the light emitting device 103. As such, it may be desirable to include a phosphor in the second portion 114 while not including a phosphor in the first portion 112. However, as the first portion 112 is below the second portion 114, phosphor may settle from the second portion 114 into the first portion 112, reducing the effectiveness of the phosphor addition in the second portion 114. Accordingly, phosphor can be added to the first portion 112 to limit such settling and/or the first portion 112 can be cured before dispensing the second portion 114.

The use of multiple dispenses may also allow the addition of a phosphor preform/wafer of a desired configuration for light conversion. In addition, multiple dispenses may allow for the use of materials having different indexes of refraction to provide, for example, a buried lens (i.e., formed by the interface between two dispenses of materials with different refractive indexes).

As illustrated in FIG. 3B, a second quantity of encapsulant material 116 is dispensed in a predetermined amount onto the cured first quantity of encapsulant material 112, 114 in the reflective cavity 115. In some particular embodiments of the present invention the second quantity 116 is about equal to the first portion 112 of the first quantity of encapsulant material 112, 114. The second quantity 116 may be substantially free of phosphor, however, in other embodiments of the present invention, phosphor may also be included in the second quantity 116.

As shown in FIG. 3C, before the second quantity of encapsulant material 116 is cured, a lens 120 is positioned within the reflective cavity 115 and against the second quantity of encapsulant material 116. The second quantity of encapsulant material 116 is then cured, for example, by heating, to harden the encapsulant material 116 and to attach the lens 120 in the reflective cavity 115. In some embodiments of the present invention, use of a double cure process as described above to encapsulate the light emitting device 103 in the package 100 may reduce delamination of the cured encapsulant material 112, 114, 116 from the light emitting device 103, the lens 120 and/or the reflector cup 104.

Figure 4A:
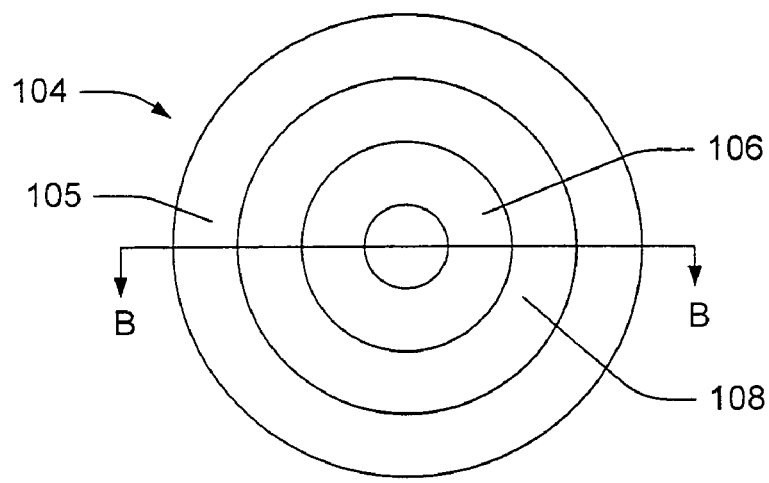
FIG. 4A is a top view illustrating a light emitting device package suitable for use with some embodiments of the present invention.
Figure 4B:
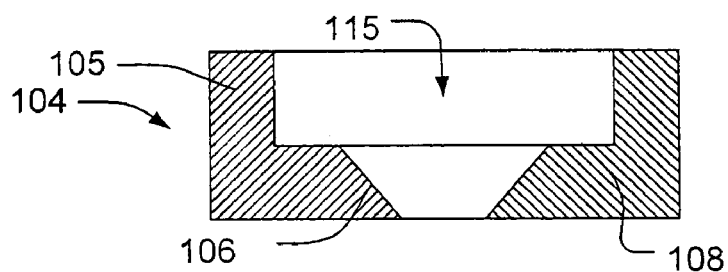
FIG. 4B is a cross-sectional side view illustrating the light emitting device package of FIG. 4A.

The reflector cup 104 shown in FIGS. 3A-3B is further illustrated in FIGS. 4A-4B. FIG. 4A is a top plan view of the reflector cup 104 showing the top surfaces of the upper sidewall 105, the lower sidewall 106 and a substantially horizontal shoulder sidewall portion 108 between the upper sidewall 105 and the lower sidewall 106. FIG. 4B is a cross-sectional view of the reflector cup 104 taken along line B-B of FIG. 4A.

Figure 5A:
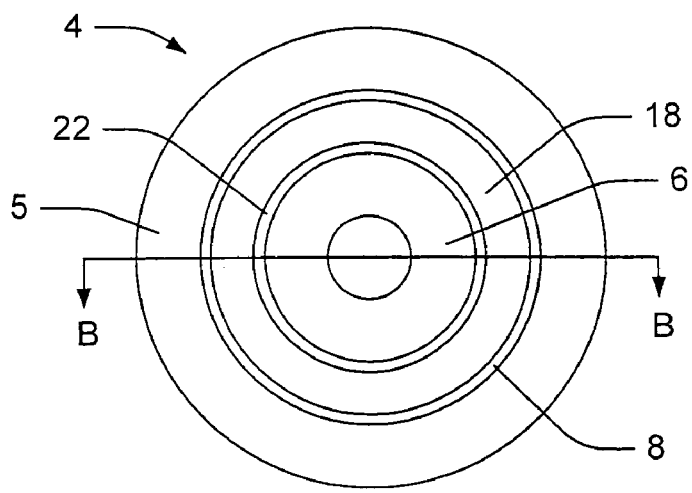
FIG. 5A is a top view illustrating a light emitting device package according to some embodiments of the present invention.
Figure 5B:
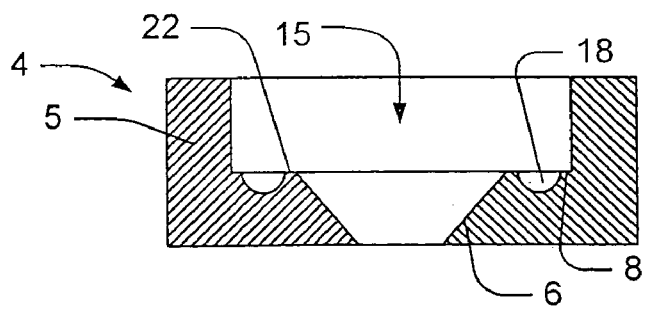
FIG. 5B is a cross-sectional side view illustrating the light emitting device package of FIG. 5A.
Figure 6:
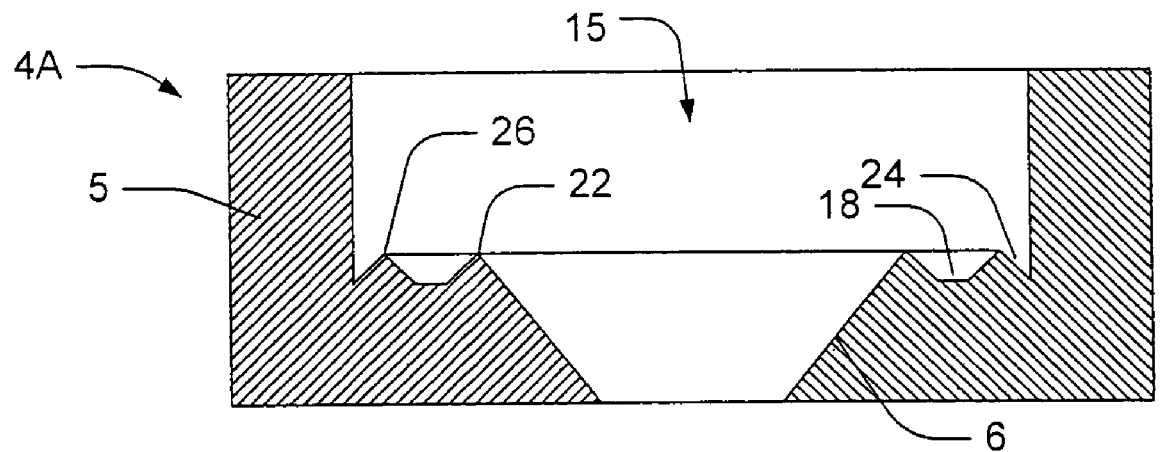
FIG. 6 is a cross-sectional side view illustrating a light emitting device package according to further embodiments of the present invention.
Figure 7:
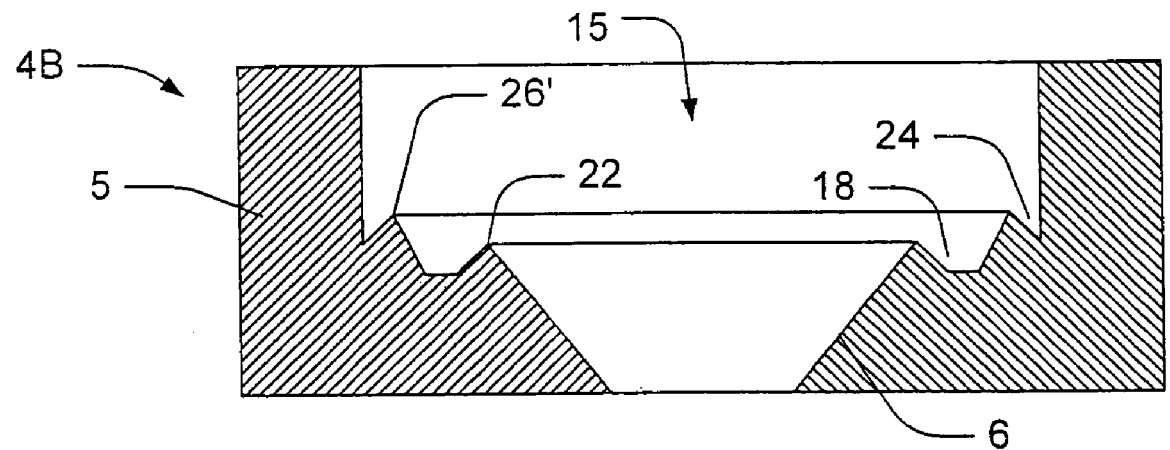
FIG. 7 is a cross-sectional side view illustrating a light emitting device package according to other embodiments of the present invention.

Alternative reflector cup configurations according to various embodiments of the present invention will now be described as well as methods for packaging of a light emitting device using such alternative reflector cup configurations. In various embodiments of the present invention, these alternative reflector cup configurations may reduce the incidence and/or amount of squeeze out of encapsulant material on insertion of a lens into encapsulant material in the reflector cup. FIGS. 5A-5B, 6 and 7 illustrate various alternative reflector configurations as will now be described. FIG. 5A is a top plan view of a reflector cup 4 and FIG. 5B is a cross-sectional view of the reflector cup 4 taken along line B-B of FIG. 5A. FIG. 6 is a cross-sectional view of a reflector cup 4A and FIG. 7 is a cross-sectional view of a reflector cup 4B. Each of the illustrated reflector cups 4, 4A, 4B includes an upper sidewall 5, an angled lower sidewall 6 and a horizontal shoulder portion 8 between the upper sidewall 5 and the lower sidewall 6, together defining a reflective cavity 15. As used herein with reference to the shoulder portion 8, "horizontal" refers to the general direction in which the shoulder portion 8 extends between the lower sidewall portion 6 and the upper sidewall portion 8 (i.e., as compared to the lower 6 and upper 5 sidewall portions), not to the particular angle of the shoulder portion 8 at any intermediate portion thereof (see, e.g., FIG. 7 where the horizontal shoulder portion may actually have some change in vertical height between the lower 6 and upper 5 sidewall portions to accommodate other features thereof). In addition, each of the reflector cups 4, 4A, 4B may include at least one moat 18 surrounding the lower sidewall 6, with the moat 18 being separated from the lower sidewall 6 by a lip (i.e., a projecting edge) 22. The moat 18 is illustrated as formed in the shoulder portion 8.

In the embodiments of FIGS. 5A-5B, the moat 18 could be formed by stamping, in which case the lip 22 between the moat 18 and the lower sidewall 6 may be provided with a sharp edge instead of a flat surface. However, it will be understand that, due to the limitations of the fabricating processes used, the flat surface of the lip 22 schematically illustrated in FIG. 5B may actually have a more rounded profile. Too much of a rounded profile may be undesirable as will be further described with reference to FIGS. 8A-8C.

Further embodiments of a reflector cup 4A will now be described with reference to the cross-sectional view of FIG. 6. As shown in FIG. 6, a first moat 18 is formed between the upper sidewall 5 and the lower sidewall 6, with a first or inner lip 22 separating the lower sidewall 6 and the first moat 18. A second moat 24 is formed between the upper sidewall 5 and the first moat 18. A second or outer lip 26 separates the second moat 24 from the first moat 18.

Yet further embodiments of a reflector cup 4B will now be described with reference to the cross-sectional view of FIG. 7. As shown in FIG. 7, a first moat 18 is formed between the upper sidewall 5 and the lower sidewall 6, with a first or inner lip 22 separating the lower sidewall 6 and the first moat 18. A second moat 24 is formed between the upper sidewall 5 and the first moat 18. A second or outer lip 26' separates the second moat 24 from the first moat 18. As illustrated in FIG. 7, the second lip 26' is elevated with respect to the first lip 22.

In particular embodiments of the present invention, the first lip 22 has a peak having a radius of curvature of less than about 50 micrometers (µm) and the second lip 26, 26' has a peak having a radius of curvature of less than about 50 µm. The first moat 18 and the second moat 24 may be stamped features of the horizontal shoulder portion 8. As shown in FIGS. 6 and 7, the second moat 24 may have a width extending from the second lip 26, 26' to the upper sidewall portion 5.

In some embodiments of the present invention, the sloped lower sidewall portion 6 may be substantially conical and may have a minimum diameter of from about 1.9 millimeters (mm) for a 500 µm light emitting device chip to about 3.2 mm for a 900 µm light emitting device chip and a maximum diameter of from about 2.6 mm for a 500 µm light emitting device chip to about 4.5 mm for a 900 µm light emitting device chip and a height of from about 0.8 mm to about 1.0 mm. The upper sidewall portion may be substantially oval and have an inner diameter of from about 3.4 mm to about 5.2 mm and a height of from about 0.6 mm to about 0.7 mm. The horizontal shoulder portion may have a width from the lower sidewall portion to the upper sidewall portion of from about 0.4 mm to about 0.7 mm. It will be understood that, as used herein, the terms "oval" and "conical" are intended to encompass circular, cylindrical and other shapes, including irregular shapes based on the fabrication technology used to form the reflector cup 4, 4A, 4B that may, nonetheless, in combination with a substrate 2 or otherwise, operate to provide a reflector for the light emitting device 103 and retain and harden an encapsulant material 12, 14, 16 therein.

In some embodiments of the present invention, the first moat 18 has a width from about 0.3 mm to about 0.4 mm and the second moat 24 has a width of from about 0.3 mm to about 0.4 mm. As illustrated in FIG. 6, the edge of the first moat 18 may be a first lip 22 having a height relative to a bottom end (i.e., a top surface of the substrate 2) of the lower sidewall portion 6 of from about 0.79 mm to about 0.85 and the edge of the second moat 24 may be a second lip 26 having a height relative to bottom end of the lower sidewall portion 6 of from about 0.79 mm to about 0.85 mm. In other embodiments of the present invention as illustrated in FIG. 7, the first lip 22 has a height relative to a bottom end of the lower sidewall portion of from about 0.79 mm to about 0.85 mm and the second lip 26' has a height relative to a bottom end of the lower sidewall portion of from about 0.9 mm to about 11.0 mm.

The reflector cups 4, 4A, 4B, in various embodiments of the present invention may, provide for meniscus control when packaging the light emitting device 103 in a reflector cup 4, 4A, 4B. As will be further described, when combined with the double cure methods described above, a distinct convex meniscus may also be provided for different dispenses of encapsulant material and, as a result, the incidence of doming failure may be reduced. In other embodiments of the present invention, the provided meniscus control may reduce the difficulty of lens placement at a desired depth and/or angle, reduce lens wicking or squeeze-out of encapsulant material onto the top of the lens and/or allow for configuration of the optical characteristics of the packaged light emitting device. For example, phosphor may be concentrated in the center (midpoint) of the package by doming (convex meniscus) of phosphor loaded encapsulant material over the midpoint of the package.

Different optical patterns (viewing angles, custom color spectrums, color temperature tuning and the like) may be provided by using multiple meniscus control techniques in combination with dispensing and/or curing variations in the process. For example, a high peaked dome of a phosphor loaded material may provide greater color spectrum uniformity of white temperature light emission with less shift to yellow towards the edges of the reflector cup by providing a more uniform length of the light path through the phosphor loaded material from the light emitting device. Similarly, where desired, a greater color spectrum variation from white at the midpoint to yellow at the edges may be provided by a flatter dome. In some other embodiments of the present invention, where protection related functionality is provided by features other than a lens, meniscus control may allow for packaging a light emitting device without a lens by using the encapsulant material as the lens, with the meniscus being configured to provide the desired lens shape.

Figure 8A:
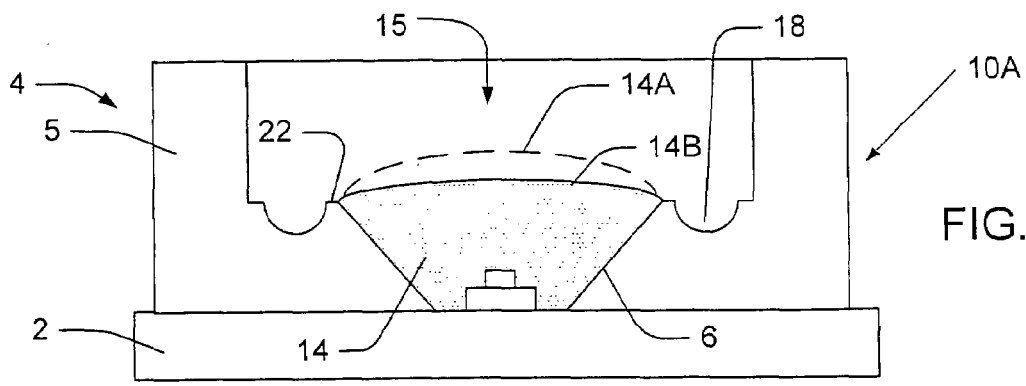
FIGS. 8A to 8C are cross-sectional side views illustrating methods of packaging a light emitting device according to further embodiments of the present invention.
Figure 8B:
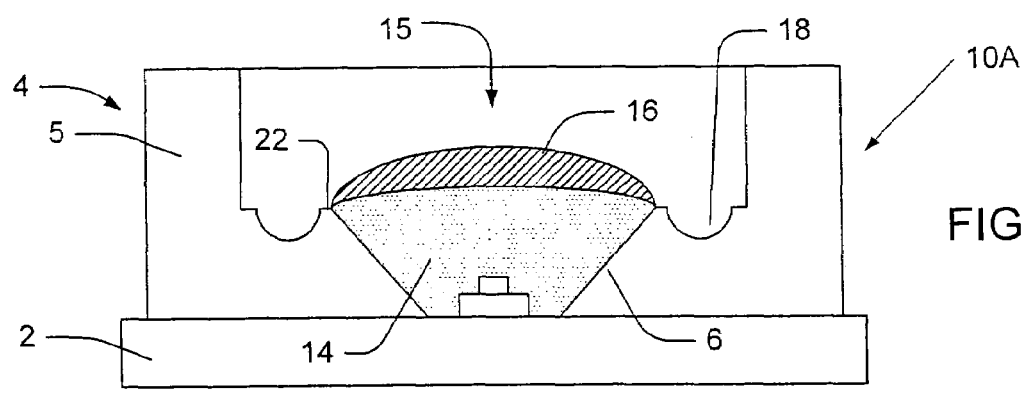
Figure 8C:
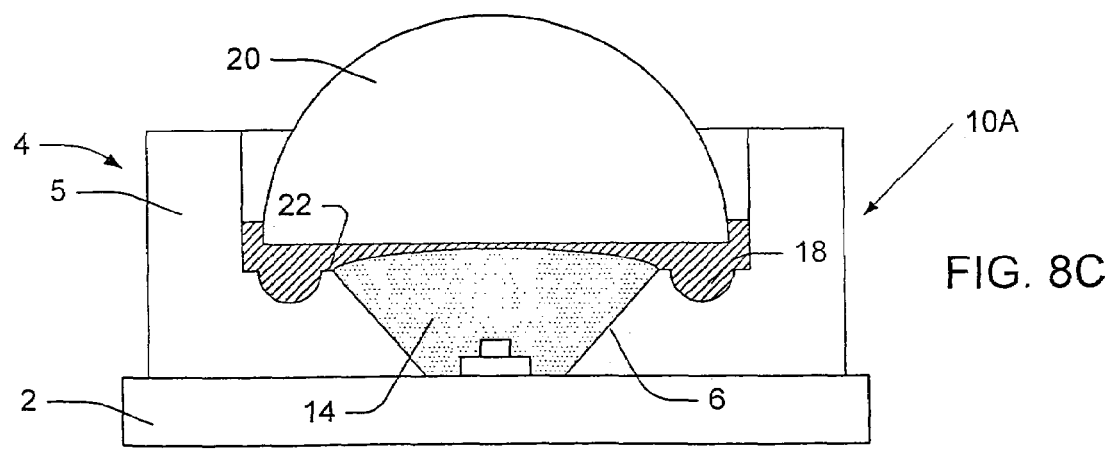

FIGS. 8A-8C illustrate methods of packaging a light emitting device, using the structural characteristics of a reflector cup for meniscus control, according to some embodiments of the present invention. The operations illustrated in FIGS. 8A-8C utilize the reflector cup 4 illustrated in FIGS. 5A-5B and the double curing operations also previously described. As shown in FIG. 8A, a first quantity 14 of encapsulant material is deposited in the reflective cavity 15 of the package 10A. In some embodiments of the present invention, the first quantity 14 may be dispensed using a separate (wetting) dispense and second dispense. With proper control of the amount of encapsulant material dispensed, surface tension will cause the liquid encapsulant material 14 to cling to the lip 22, forming a convex meniscus as illustrated in FIG. 8A at a height indicated at 14A. Thus, the lip 22 may be used to prevent the dispensed encapsulant material 14 from contacting and wicking up the upper sidewall 5 and forming a concave meniscus as shown in FIG. 1.

The dispensed encapsulant material 14 is cured, for example, by heating, and may shrink down to a height indicated at 14B. As shown in FIG. 8B, a second quantity 16 of encapsulant material is then dispensed into the cavity 15 on the cured first quantity 14 of encapsulant material. In some embodiments, as illustrated in FIG. 8B, the second quantity 16 of encapsulant material may also cling to the same edge of the lip 22 to form a convex meniscus. In other embodiments, the lip 22 may have an inner and outer edge thereon and the second quantity 16 of encapsulant material may cling to the outer edge and the first quantity 14 may cling to the inner edge. Thus, the second quantity 16 of encapsulant material may also not contact or wick up the upper sidewall 5 to form a concave meniscus.

Figure 2:
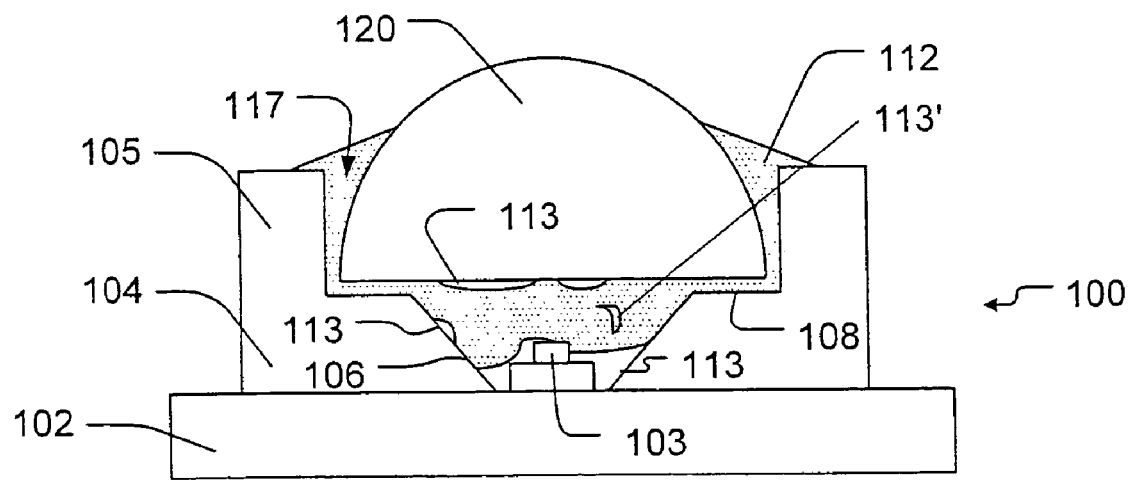

Referring to FIG. 8C, the lens 20 is inserted into reflective cavity 15 and brought into contact with the uncured liquid encapsulant material 16. As such, the encapsulant material 16 may be squeezed out from underneath the lens 20. However, in some embodiments of the present invention, instead of squeezing out onto the exposed upper surfaces of the reflector cup and the lens (as shown in FIG. 2), the excess of the encapsulant material 16 is squeezed into and received by the moat 18, thus limiting wicking of the encapsulant material 16 up the sidewall 5 even after the lens 20 is inserted and the convex meniscus shown in FIG. 8B is displaced. The encapsulant material 16 is then cured to attach the lens 20 in the package 10A and to solidify the encapsulant material 16.

Figure 9A:
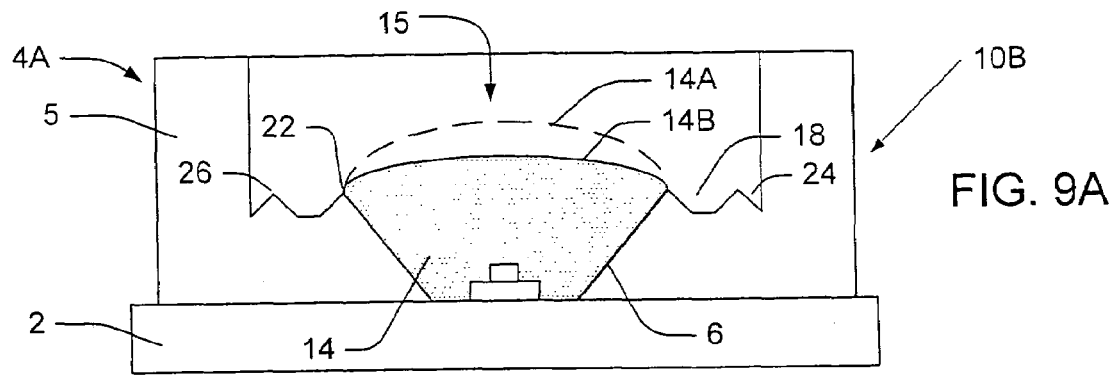
FIGS. 9A to 9C are cross-sectional side views illustrating methods of packaging a light emitting device according to other embodiments of the present invention.
Figure 9B:
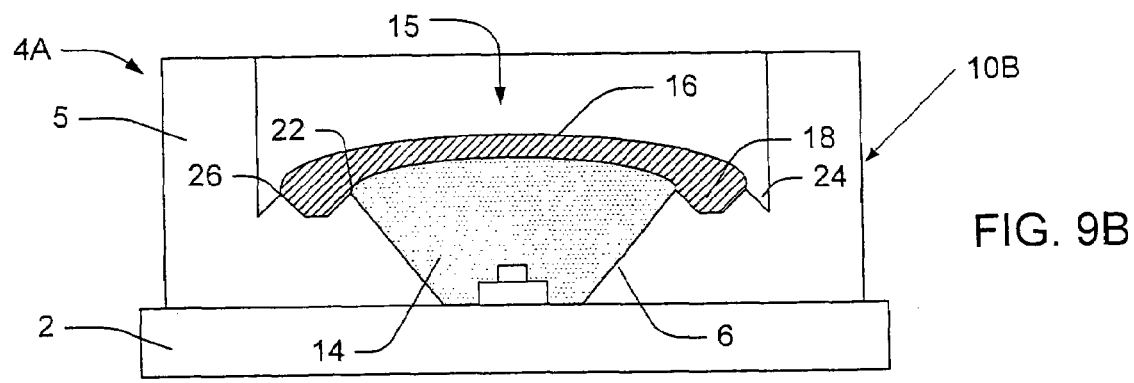
Figure 9C:
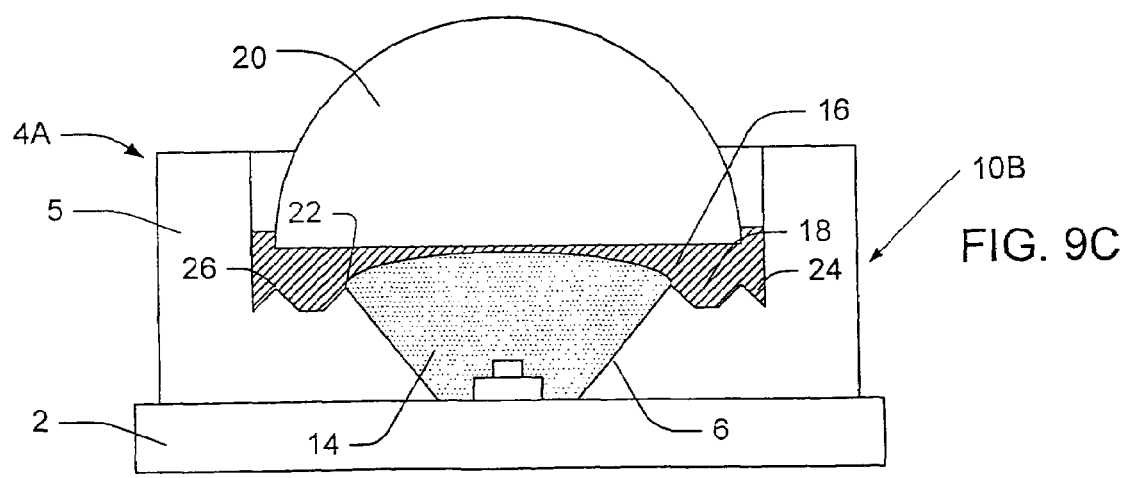

FIGS. 9A-9C illustrate methods of packaging a light emitting device, using the structural characteristics of a reflector cup for meniscus control, according to some embodiments of the present invention. The operations illustrated in FIGS. 9A-9C utilize the reflector cup 4A illustrated in FIG. 6 and the double curing operations also previously described. As shown in FIG. 9A, a first quantity 14 of encapsulant material is deposited in the reflective cavity 15 of the package 10B. In some embodiments of the present invention, the first quantity 14 may be dispensed using a distinct first (wetting) dispense and a second dispense after wetting of the light emitting device. With proper control of the amount of encapsulant material dispensed, surface tension will cause the liquid encapsulant material 14 to cling to the inner lip 22, forming a convex meniscus as illustrated in FIG. 9A at a height indicated at 14A. Thus, the inner lip 22 may be used to prevent the dispensed encapsulant material 14 from contacting and wicking up the upper sidewall 5 and forming a concave meniscus as shown in FIG. 1.

The dispensed encapsulant material 14 is cured, for example, by heating, and may shrink down to a height indicated at 14B. As shown in FIG. 9B, a second quantity 16 of encapsulant material is then dispensed into the reflective cavity 15 on the cured first quantity 14 of encapsulant material. In some embodiments, as illustrated in FIG. 9B, the second quantity 16 of encapsulant material clings to the outer lip 26, forming a convex meniscus. Thus, the outer lip 26 may be used to prevent the dispensed second quantity 16 of encapsulant material from contacting and wicking up the upper sidewall 5 and forming a concave meniscus as shown in FIG. 1.

Referring to FIG. 9C, the lens 20 is inserted into reflective cavity 15 and brought into contact with the uncured liquid encapsulant material 16. As such, the encapsulant material 16 may be squeezed out from underneath the lens 20. However, in some embodiments of the present invention, instead of squeezing out onto the exposed upper surfaces of the reflector cup and the lens (as shown in FIG. 2), the excess of the encapsulant material 16 is squeezed into and received by the second moat 24, thus limiting wicking of the encapsulant material 16 up the sidewall 5 even after the lens 20 is inserted and the convex meniscus shown in FIG. 9B is displaced. The encapsulant material 16 is then cured to attach the lens 20 in the package 10B and to solidify the encapsulant material 16.

FIG. 9C further illustrates that, in some embodiments of the present invention, the cured encapsulant 14 may be used as a stop to provide for level (depth of placement) control for the lens 20. Such control over the positioning of the lens 20 may facilitate the production of parts with more consistent optical performance.

As shown in FIG. 9C, the lens 20 in some embodiments of the present is positioned without advancing into the cavity until it contacts the cured first quantity of encapsulant material 14 as a film of the encapsulant material 16 remains therebetween. Thus, in some embodiments of the present invention, the device is configured so that the lens 20 may be advanced to a position established by the first quantity of encapsulant material 14, which position may be established with or without contact of the lens 20 to the cured encapsulant material 14 in various embodiments of the present invention.

Figure 10A:
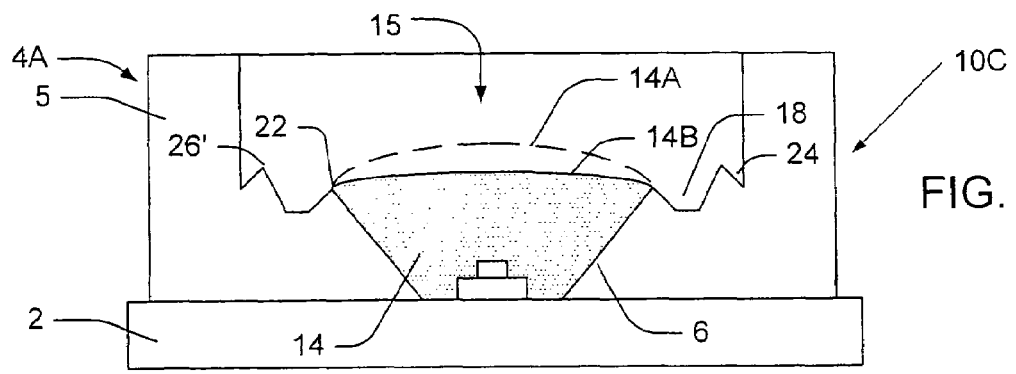
FIGS. 10A to 10C are cross-sectional side views illustrating methods of packaging a light emitting device according to yet further embodiments of the present invention.
Figure 10B:
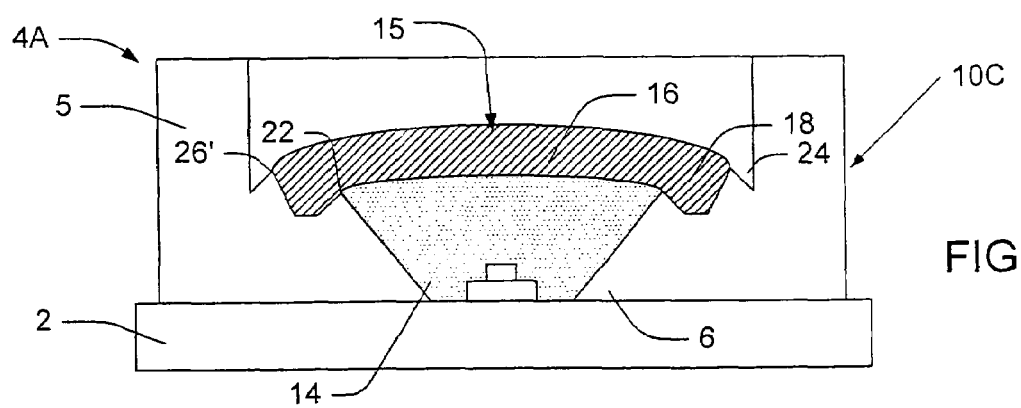
Figure 10C:
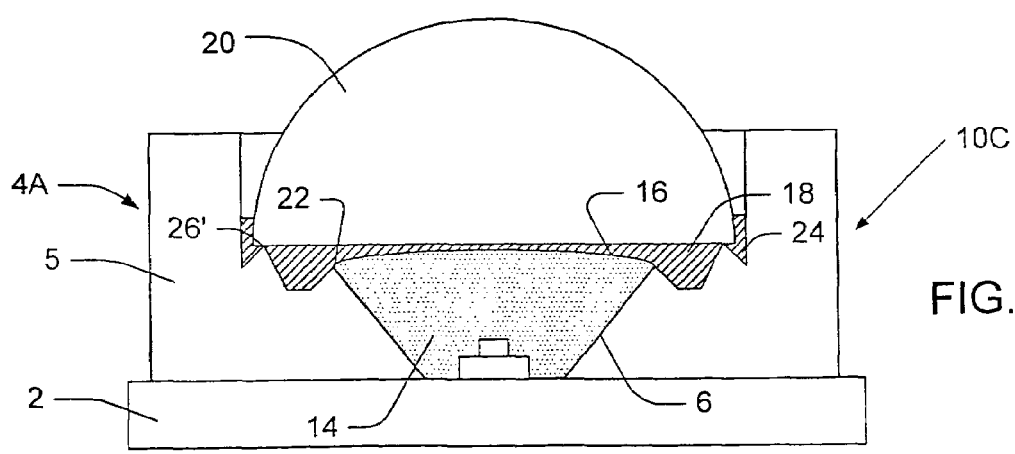

FIGS. 10A-10C illustrate methods of packaging a light emitting device, using the structural characteristics of a reflector cup for meniscus control, according to some embodiments of the present invention. The operations illustrated in FIGS. 10A-10C utilize the reflector cup 4B illustrated in FIG. 7 and the double curing operations also previously described. As shown in FIG. 10A, a first quantity 14 of encapsulant material is deposited in the reflective cavity 15 of the package 10C. In some embodiments of the present invention, the first quantity 14 may be dispensed using a separate (wetting) dispense and a second dispense. With proper control of the amount of encapsulant material dispensed, surface tension will cause the liquid encapsulant material 14 to cling to the inner lip 22, forming a convex meniscus as illustrated in FIG. 10A at a height indicated at 14A. Thus, the inner lip 22 may be used to prevent the dispensed encapsulant material 14 from contacting and wicking up the upper sidewall 5 and forming a concave meniscus as shown in FIG. 1.

The dispensed encapsulant material 14 is cured, for example, by heating, and may shrink down to a height indicated at 14B. As shown in FIG. 10B, a second quantity 16 of encapsulant material is then dispensed into the reflective cavity 15 on the cured first quantity 14 of encapsulant material. In some embodiments, as illustrated in FIG. 10B, the second quantity 16 of encapsulant material clings to the outer lip 26', forming a convex meniscus. Thus, the outer lip 26' may be used to prevent the dispensed second quantity 16 of encapsulant material from contacting and wicking up the upper sidewall 5 and forming a concave meniscus as shown in FIG. 1.

Referring to FIG. 10C, the lens 20 is inserted into reflective cavity 15 and brought into contact with the uncured liquid encapsulant material 16. As such, the encapsulant material 16 may be squeezed out from underneath the lens 20. However, in some embodiments of the present invention, instead of squeezing out onto the exposed upper surfaces of the reflector cup and the lens (as shown in FIG. 2), the excess of the encapsulant material 16 is squeezed into and received by the second moat 24, thus limiting wicking of the encapsulant material 16 up the sidewall 5 even after the lens 20 is inserted and the convex meniscus shown in FIG. 10B is displaced.

The encapsulant material 16 is then cured to attach the lens 20 in the package 10C and to solidify the encapsulant material 16.

FIG. 10C further illustrates that, in some embodiments of the present invention, the outer lip 26' may be used as a stop to provide for level (depth of placement) control for the lens 20. Such control over the positioning of the lens 20 may facilitate the production of parts with more consistent optical performance. In this embodiment, the lens placement does not depend on the amount of shrinkage of the encapsulant during the first cure step. For the embodiments illustrated in FIG. 10C, as contrasted with those illustrated in FIG. 9C, the placement of the lens 20 need not be dependent on the amount of shrinkage of the first quantity 14 of encapsulant material as the placement depth is, instead, defined by the height of the outer lip 26'. As such, in some embodiments of the present invention, the placement may be more exact, which may result in improved optical performance of the package 10C.

Figure 11:
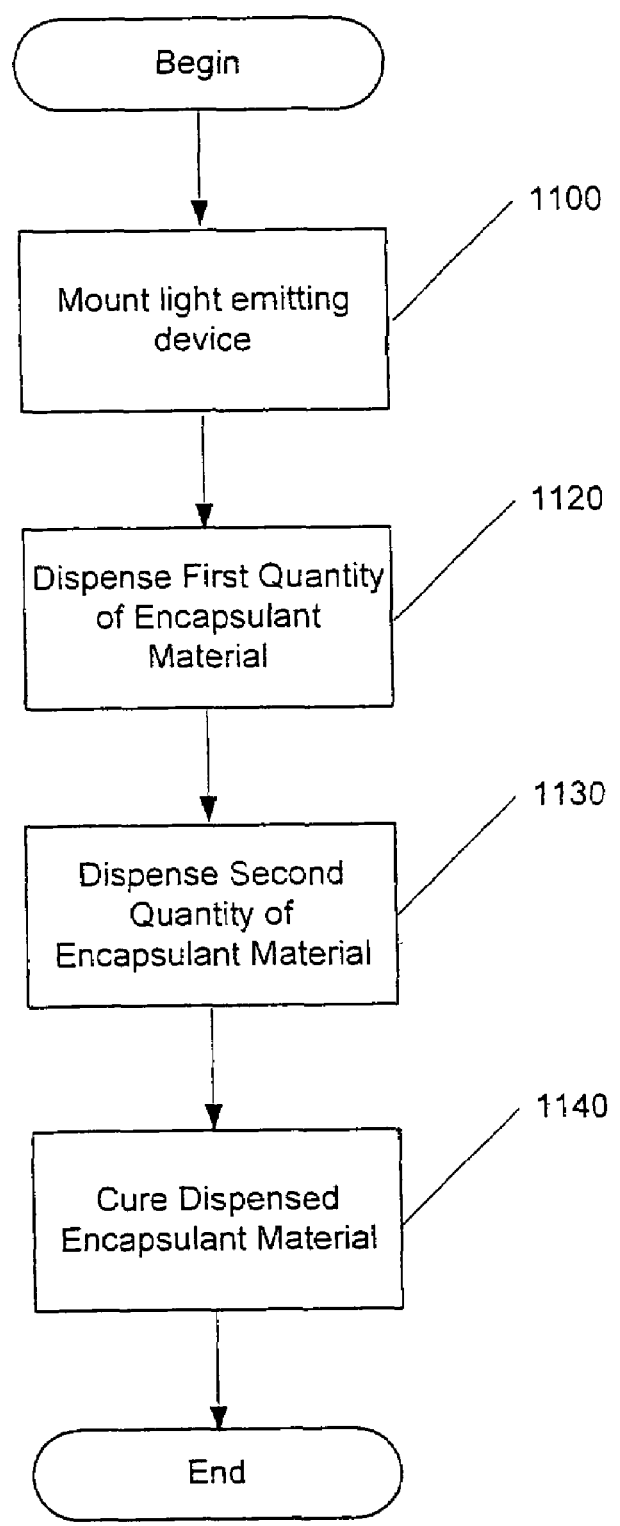
FIG. 11 is a flowchart illustrating operations for packaging a light emitting device according to some embodiments of the present invention.

Methods for packaging a light emitting device using a first (wetting) dispense according to some embodiments of the present invention will now be further described with reference to the flowchart illustrations of FIG. 11. As shown in FIG. 11, operations may begin at Block 1100 by mounting the light emitting device on a bottom surface of a reflective cavity. The mounted light emitting device has an associated height relative to the bottom surface of the reflective cavity. A first quantity of encapsulant material is dispensed into the reflective cavity including the light emitting device (Block 1120).

The first quantity may be sufficient to substantially cover the light emitting device without forming any air pockets in the encapsulant material. In some embodiments of the present invention, the first quantity may be sufficient to wet the light emitting device without filling the reflective cavity to a level exceeding the height of the light emitting device. In other embodiments of the present invention, the time/speed of dispense of the encapsulant material may be changed to reduce the formation of air pockets in the encapsulant material. In yet further embodiments, a single dispense may be used, for example, with a slow dispense rate, from a small dispense needle, low pressure, or the like, allowing an air pocket to potentially form and then cave/collapse before enough encapsulant material has been dispensed to prevent collapse of the air pocket. Thus, the first (wetting) dispense and second dispense may be provided by a continuous dispense at a selected rate of a selected viscosity encapsulant material that allows cave/collapse of a formed air pocket during the dispense operation The first quantity may be sufficient to wet the light emitting device without filling the reflective cavity to a level exceeding the height of the light emitting device.

A second quantity of encapsulant material is dispensed onto the first quantity of encapsulant material (Block 1130). The dispensed first and second quantity of encapsulant material are then cured (Block 1140). In some embodiments of the present invention, the first dispensed wetting quantity of encapsulant material may be cured before the remainder of the encapsulant material is dispensed.

The first quantity 12, 14 and the second quantity 16 of the encapsulant material may be the same or different materials. Similarly, the first 12 and second 14 portions of the first quantity of the encapsulant material may be the same or different materials. Examples of materials that may be used as an encapsulant material in various embodiments of the present invention include silicon.

Figure 12:
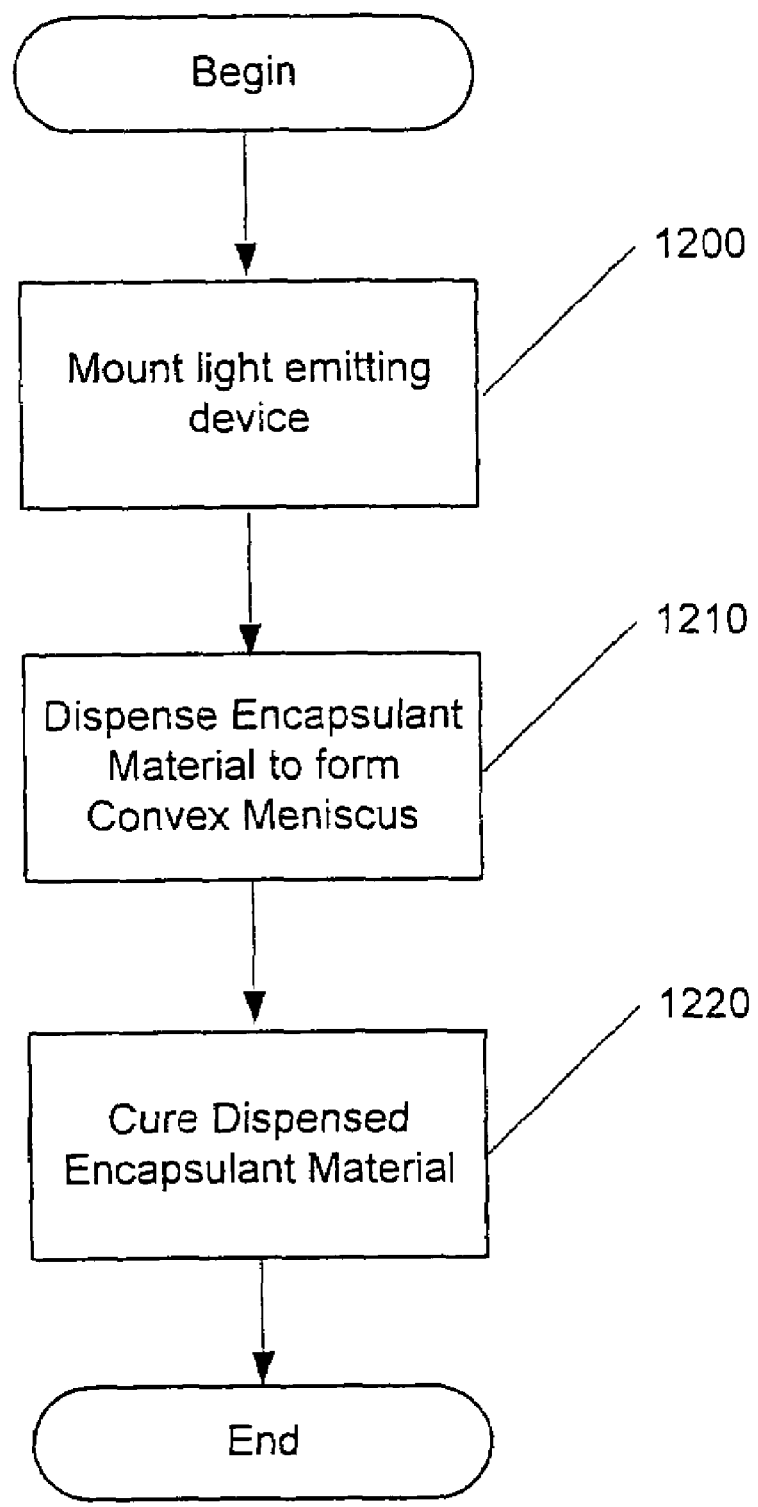
FIG. 12 is a flowchart illustrating operations for packaging a light emitting device according to some other embodiments of the present invention.

Operations related to packaging a semiconductor light emitting device according to some embodiments of the present invention using meniscus control will now be described with reference to the flowchart illustration of FIG. 12. As shown in FIG. 12, operations may begin at Block 1200 with mounting of the light emitting device 103 in a reflective cavity 15 of a reflector 5. Encapsulant material is dispensed into the reflective cavity 15 including the light emitting device 103 therein to cover the light emitting device 103 and to form a convex meniscus of encapsulant material in the reflective cavity extending from an edge of the moat without contacting the upper sidewall 5 of the reflector 4, 4A, 4B (Block 1210). More generally, operations at Block 1210 provide for formation of a convex meniscus extending from an outer edge of the meniscus that is at a height positioning the outer edge of the meniscus within the reflective cavity 15. For example, selection of materials used for the upper sidewall 5 and the encapsulant material 12, 14, 16 may facilitate formation of a convex, rather than concave, meniscus extending into the reflective cavity 15. The encapsulant material 12, 14, 16 is in the reflective cavity 15 (Block 1220). In embodiments where a lens 20 is included in the package 10A, 10B, 10C, insertion of the lens 20 may include collapsing the convex meniscus and moving a portion of the encapsulant material 12, 14, 16 into the moat 18, 24 with the lens 20 and then curing the encapsulant material 12, 14, 16 to attach the lens 20 in the reflective cavity 15. Alternatively, the encapsulant material 12, 14, 16 may be cured to form a lens for the packaged light emitting device 103 from the encapsulant material 12, 14, 16 and the encapsulant material 12, 14, 16 may be dispensed to form a convex meniscus providing a desired shape of the lens.

Figure 13:
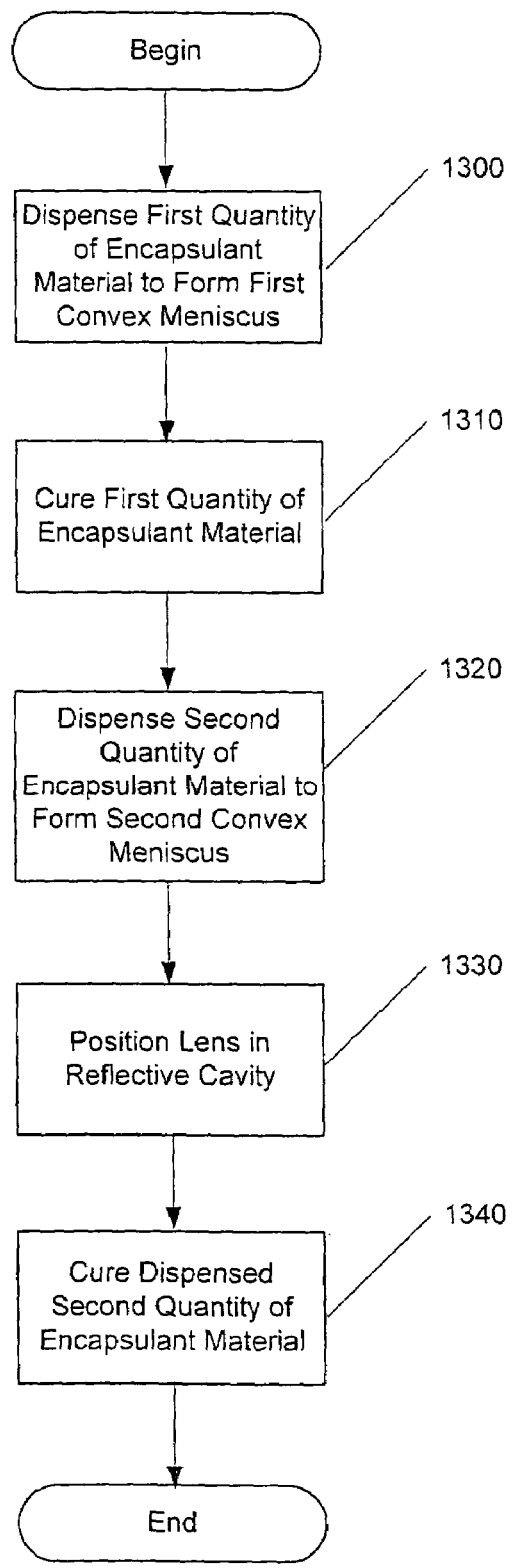
FIG. 13 is a flowchart illustrating operations for packaging a light emitting device according to yet further embodiments of the present invention.

Embodiments of methods of packaging a semiconductor light emitting device 103 in a reflector 4, 4A, 4B having a moat 18, 24 positioned between a lower 6 and an upper 5 sidewall thereof, the upper 5 and lower 6 sidewall defining a reflective cavity 15, using a multiple dispense and/or cure operation will now be further described with reference to FIG. 13. As shown in the embodiments of FIG. 13, operations begin at Block 1300 by dispensing a first quantity 14 of encapsulant material into the reflective cavity 15 to form a first convex meniscus. The first quantity 14 of encapsulant material is cured (Block 1310). A second quantity 16 of encapsulant material is dispensed onto the cured first quantity 14 of encapsulant material to form a second convex meniscus of encapsulant material in the reflective cavity 15 extending from an edge of the moat 18, 24 without contacting the upper sidewall 5 of the reflector 4, 4A, 4B (Block 1320).

The second convex meniscus and the first convex meniscus of encapsulant material may both extend from the same edge of the moat 18 as illustrated in FIG. 8B. However, in other embodiments of the present invention, the moat 18, 24 may have an inner edge and an outer edge, such as the first lip 22 and the second lip 26, 26', and the second convex meniscus of encapsulant material extends from the outer edge (second lip 26, 26') of the moat 18, 24 and the first convex meniscus of encapsulant material extends from the inner edge (first lip 22) of the moat 18, 24. Thus, using the first lip 22, the inner moat 18 may be configured to limit wicking of encapsulant material 14 outwardly along the horizontal shoulder portion 8 to allow formation of a first convex meniscus of encapsulant material dispensed into the reflective cavity 15. Using the second lip 26, 26', the outer moat 24 may be configured to limit wicking of encapsulant material outwardly along the horizontal shoulder portion 8 to allow formation of a second convex meniscus of encapsulant material dispensed into the reflective cavity 15.

In some embodiments of the present invention including a lens, the lens 20 is positioned in the reflective cavity 15 proximate the dispensed second quantity 16 of encapsulant material (Block 1330). Positioning the lens 20 may include collapsing the second convex meniscus and moving a portion of the second quantity 16 of encapsulant material into the outer moat 24 with the lens 20 as illustrated in FIGS. 9C and 10C. In addition, as illustrated in FIG. 10C, the second lip 26' may have a height greater than that of the first lip 22. The height of the second lip 26' may be selected to provide a desired position for the lens 20 and the lens 20 may be moved into the reflective cavity 15 until it contacts the second lip 26'. In other embodiments of the present invention, as illustrated in FIG. 9C, the lens 20 is advanced into the reflective cavity 15 until it contacts the cured first quantity 14 of encapsulant material and the dispensed first quantity 14 of encapsulant material sufficient to establish a desired position for the lens 20 in the reflective cavity 15. The dispensed second quantity 16 of encapsulant material is cured to attach the lens 20 in the reflective cavity 15 (Block 1340).

The flowcharts of FIGS. 11-13 and the schematic illustrations of FIGS. 8A-8C, 9A-9C and 10A-10C illustrate the functionality and operation of possible implementations of methods for packaging a light emitting device according to some embodiments of the present invention. It should be noted that, in some alternative implementations, the acts noted in describing the figures may occur out of the order noted in the figures. For example, two blocks/operations shown in succession may, in fact, be executed substantially concurrently, or may be executed in the reverse order, depending upon the functionality involved.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A method of packaging a semiconductor light emitting device, comprising:
   dispensing a first quantity of encapsulant material having a first index of refraction into a reflective cavity including the light emitting device;
   curing the first quantity of encapsulant material;
   dispensing a second quantity of encapsulant material having a second index of refraction, different from the first index of refraction, onto the cured first quantity of encapsulant material, wherein the first and second index of refraction are selected to provide a buried lens in the reflective cavity; and
   curing the second quantity of encapsulant material to form the buried lens.

2. The method of claim 1 wherein the light emitting device comprises a light emitting diode (LED).

3. The method of claim 1 wherein dispensing a first quantity of encapsulant material includes:
   dispensing a first portion of the first quantity of encapsulant material into the reflective cavity including the light emitting device, the first portion being sufficient to wet the light emitting device without filling the reflective cavity to a level exceeding a height of the light emitting device; and
   dispensing a second portion of the first quantity of encapsulant material onto the first portion of the first quantity of encapsulant material.

4. The method of claim 1 wherein dispensing a first quantity of encapsulant material includes:
   dispensing a first portion of the first quantity of encapsulant material into the reflective cavity including the light emitting device, the first portion of the first quantity being sufficient to substantially cover the light emitting device without forming any air pockets in the encapsulant material;
   dispensing a second portion of the first quantity of encapsulant material onto the first portion of the first quantity of encapsulant material.

5. A method of packaging a semiconductor light emitting device, comprising:
   dispensing a first portion of a first quantity of encapsulant material into a reflective cavity including the light emitting device;
   ceasing dispensing of the first quantity of encapsulant material while the first portion settles;

dispensing a second portion of the first quantity of encapsulant material onto the settled first portion of the first quantity of encapsulant material;

curing the first quantity of encapsulant material in the reflective cavity;

dispensing a second quantity of encapsulant material onto the cured first quantity of encapsulant material;

positioning a lens in the reflective cavity on the dispensed second quantity of encapsulant material;

curing the dispensed second quantity of encapsulant material to attach the lens in the reflective cavity.

6. The method of claim 5 wherein the first portion is sufficient to wet the light emitting device and wherein the first portion does not fill the reflective cavity to a level exceeding a height of the light emitting device.

7. The method of claim 5 wherein the first portion of the first quantity is sufficient to substantially cover the light emitting device without forming any air pockets in the encapsulant material.

8. The method of claim 7 wherein the second portion is about twice the first portion.

9. The method of claim 8 wherein the second quantity is about equal to the first portion of the first quantity.

10. The method of claim 9 wherein the first portion is sufficient to fill the reflective cavity to a height of about 250 microns.

11. The method of claim 7 wherein curing the first quantity of encapsulant material includes curing the first portion of the first quantity of encapsulant material before dispensing the second portion of the first quantity of encapsulant material and wherein the first portion of the first quantity of encapsulant material includes a phosphor and wherein the second portion of the first quantity of encapsulant material is substantially free of phosphor.

12. The method of claim 5 wherein mounting the light emitting device comprises mounting the light emitting device at about a midpoint of the reflective cavity and wherein dispensing a first portion and a second portion of a first quantity of encapsulant material and dispensing a second quantity of encapsulant material comprise dispensing the encapsulant material at a point displaced from the midpoint towards a sidewall of the cavity so that the encapsulant material is not dispensed directly onto the light emitting device.

13. The method of claim 5 wherein the encapsulant material comprises a silicone gel.

14. The method of claim 5 wherein positioning the lens comprises advancing the lens into the reflective cavity until it contacts the cured first quantity of encapsulant material and wherein dispensing the first and second portions of the first quantity of encapsulant material comprises dispensing a first quantity of encapsulant material sufficient to establish a desired position for the lens in the reflective cavity.

15. The method of claim 5 wherein the first portion of the first quantity of encapsulant material includes a phosphor and wherein the second quantity of encapsulant material is substantially free of phosphor.

16. The method of claim 5 wherein the light emitting device comprises a light emitting diode (LED).

17. The method of claim 5 further comprising mounting the light emitting device on a bottom surface of the reflective cavity.

18. The method of claim 5 wherein dispensing the first portion of the first quantity of encapsulant material includes forming a bead of the encapsulant material on an end of a dispenser and contacting the formed bead with the reflective cavity and/or the light emitting device to dispense the bead from the dispenser.

* * * * *